United States Patent [19]

Buckley et al.

[11] 3,806,844

[45] Apr. 23, 1974

[54] UHF VARACTOR TUNER HAVING A CHASSIS OF UNITARY CONSTRUCTION

[75] Inventors: John R. Buckley, Chicago; John Ma, Glenview, both of Ill.

[73] Assignee: Zenith Radio Corporation, Chicago, Ill.

[22] Filed: Oct. 27, 1972

[21] Appl. No.: 301,706

[52] U.S. Cl. ............ 334/15, 331/117 D, 333/84 M

[51] Int. Cl. ............ H03j 3/06

[58] Field of Search ............ 334/14, 15; 331/117 D; 333/84 M

[56] References Cited

UNITED STATES PATENTS

| | | | |
|---|---|---|---|
| 3,624,554 | 11/1971 | Hilliker | 331/117 D |
| 3,483,483 | 12/1969 | Erler et al. | 331/117 D X |
| 3,679,990 | 7/1972 | Hiday et al. | 334/15 |
| 3,289,123 | 11/1966 | Bomhardt et al. | 334/15 |
| 3,264,566 | 8/1966 | Kaufman et al. | 334/14 X |

*Primary Examiner*—Archie R. Borchelt
*Assistant Examiner*—Saxfield Chatmon, Jr.
*Attorney, Agent, or Firm*—Nicholas A. Camasto; John J. Pederson

[57] ABSTRACT

A UHF varactor tuner having a plurality of tuned circuits has a chassis of unitary construction and is structured to provide inductance, capacitance trimming, and inductance trimming elements for matching the tuned circuits. Each tuned circuit comprises a discrete varactor diode and a transmission line inductor formed from the chassis and which lies substantially within the chassis plane. The tuned circuits to be trimmed additionally comprise a first capacitor plate at one end of the transmission line inductor, an inductance shunt also formed from the chassis and in close proximity to the inductor to provide trimming therefor, and a tab terminating in a second capacitor plate also an integral part of the chassis, aligned with the first capacitor plate such that when bent over, the second capacitor plate overlies the first capacitor plate to constitute a trimming capacitor.

7 Claims, 4 Drawing Figures

PATENTED APR 23 1974 3,806,844

SHEET 1 OF 2

UHF VARACTOR TUNER HAVING A CHASSIS OF UNITARY CONSTRUCTION

BACKGROUND OF THE INVENTION

The present invention is directed to an improved UHF varactor tuner and more particularly to an improved chassis structure for a UHF varactor tuner.

UHF varactor tuners are well known and are finding increased popularity for incorporation into commercial television receivers. Such tuners usually comprise antenna, interstage filter, and heterodyne oscillator stages, each having at least one tuned circuit comprising a varactor diode and an inductor.

As well known, to achieve optimum tuner performance, it is necessary for the tuned circuits to track together. In other words, the resonant frequency of each tuned circuit should change equally for any given variation in tuning voltage. Unfortunately, since commercially available varactor diodes are not ideally matched, and assembly tolerances are critical for such tuners, inductance and capacitance trimming of the tuned circuits to facilitate proper tracking adjustment is required.

Inductors for UHF tuners are commonly of the transmission line variety and take the form of a relatively short narrow strip of sheet metal disposed perpendicular to the tuner chassis. Such inductors are particularly suitable for such applications since they may be rigidly supported on the tuner chassis and occupy little chassis space. An inductance shunt usually taking the form of a metal band secured to the tuner chassis along side in close proximity to the inductor strip facilitates trimming of the inductor. The inductance is trimmed by adjusting the spacing between the transmission line strip and the metal band. The inductance decreases for closer spacing and increases for greater spacing.

Trimming capacitors for the varactor diodes are usually of the type having a pair of plates disposed perpendicular to, and individually secured to the chassis surface. As well known, as the spacing of the capacitor plates is made smaller the capacitance increases and as the spacing of the plates is made greater the capacity decreases. By placing the capacitors in parallel with the varactor diodes effective capacitance trimming is obtained.

In order to adjust the tuner stages for proper tracking, the trimming inductors and trimming capacitors previously described are commonly provided for all but one of the tuned circuits. The tuned circuits having the trimming capacitors and inductors are then adjusted to match the tuned circuit without the trimming devices to thus render all tuner stages properly matched.

While prior art structures for matching the UHF tuned circuits have been generally successful, many individual component parts are required. For each tuned circuit an individual inductor strip must be placed onto the chassis. In addition, each circuit to be trimmed requires an inductance shunt along with the two plates of the trimming capacitor. Such a tuner construction thus requires many individual component parts to be placed onto the tuner chassis and a corresponding number of manufacturing operations. As previously explained, the prior art individual components are disposed perpendicular to the chassis surface. This makes the wiring of the tuner circuit particularly difficult since the wiring must either be performed on the side of the chassis opposite the inductance and capacitance elements or arranged so as not to interfere with these elements. Also, any shielding between the tuned circuits must be provided by metal strips above the chassis surface adding additional component parts to the tuner construction.

It is therefore an object of the present invention to provide a new and improved chassis construction for a UHF varactor tuner which avoids prior art difficulties.

It is a further object of the invention to provide a new and improved chassis construction for a UHF varactor tuner which minimizes the number of individual component parts previously required for matching the tuned circuits.

It is a still further object of the invention to provide a chassis for a UHF varactor tuner which is of unitary construction.

SUMMARY OF THE INVENTION

The invention provides a UHF varactor tuner of the type for receiving television signals within the 470 MHz to 890 MHz frequency range and for converting the television signals to intermediate frequency signals having video and audio components, and having a metal chassis and a plurality of tuned circuits tuned by capacitance and inductance, wherein the improvement comprises at least one of the tuned circuits comprising a transmission line inductor, a trimming capacitor, and an inductance shunt, each formed from the chassis to thereby minimize the individual component parts for providing the inductance, capacitance and effective trimming therefor.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings and in the several figures of which like reference numerals indicate identical elements and in which:

DESCRIPTION OF THE PREFERRED EMBODIMENT

Figure 1:
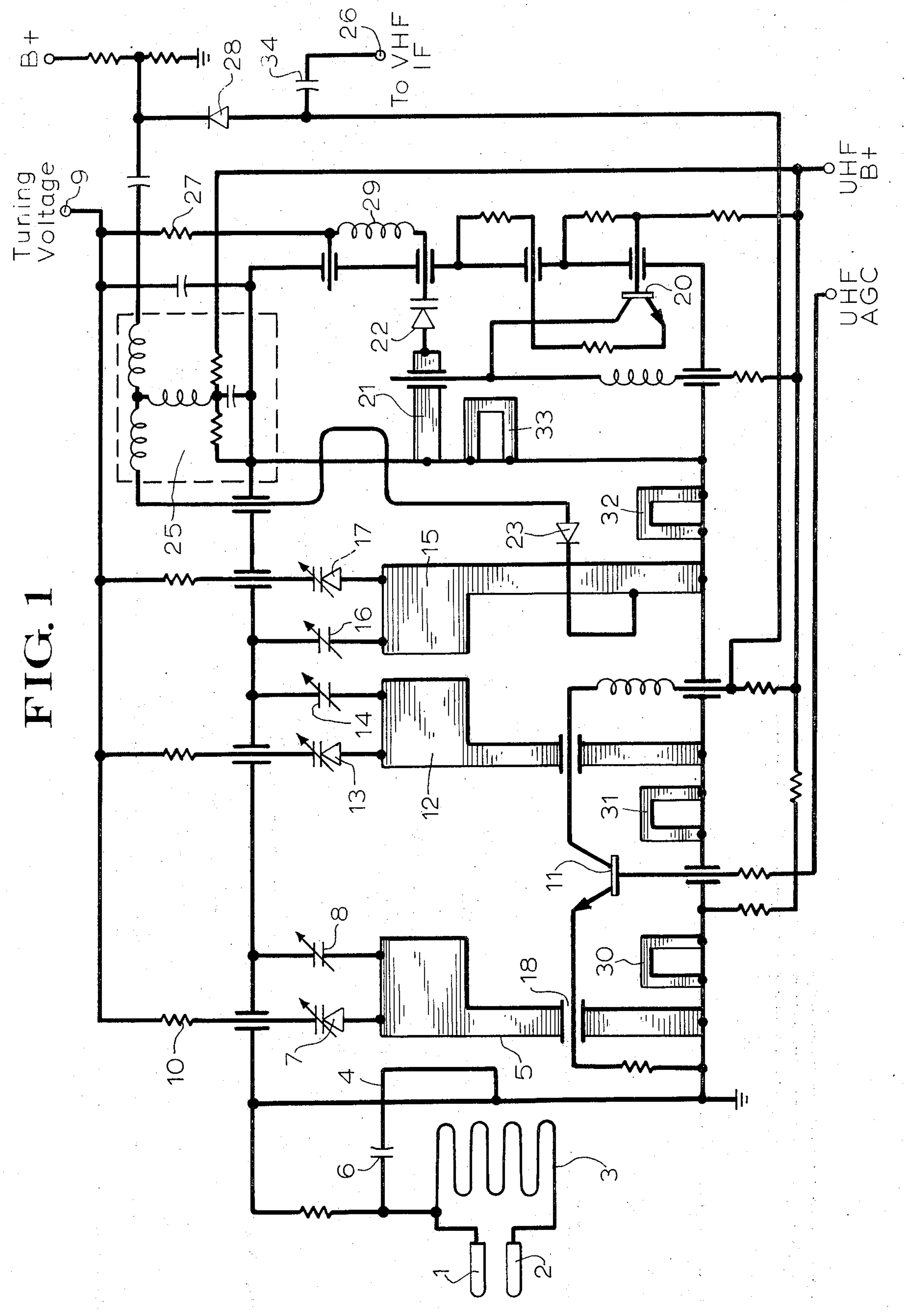
FIG. 1 is a schematic circuit diagram of a UHF tuner suitable for incorporating the present invention.

FIG. 1 is a schematic circuit diagram of a UHF varactor tuner of the type which may incorporate the present invention. A television signal in the UHF band intercepted by an antenna (not shown) connected to input terminals 1 and 2 of balun 3 is coupled to transmission line inductor 5 by the mutual inductance between inductor 5 and lead 4 of input capacitor 6. Inductor 5, inductance shunt 30, varactor diode 7, and trimming capacitor 8 comprise a tuned circuit which limits the tuning bandwidth of the tuner about some center frequency determined by the tuning voltage applied to terminal 9 and supplied to varactor diode 7 through resistor 10. The received signal is then coupled by feedthrough capacitor 18 to RF amplifier transistor 11 where the UHF signal is amplified. The amplified UHF signal is then coupled to a doubly tuned interstage filter comprising a first tuned circuit comprising transmission line inductor 12, inductance shunt 31, varactor diode 13, and trimming capacitor 14 and a second tuned circuit comprising transmission line inductor 15, inductance shunt 32, varactor diode 17, and trimming capacitor 16. The two tuned circuits of the doubly tuned interstage filter are mutually coupled together to further restrict the bandwidth of the tuner to provide improved selectivity, to reduce adjacent channel cross modulation, and to reject other spurious signals outside of its bandwidth. The double-tuned interstage filter is also tuned by the tuning voltage at terminal 9 applied to varactor diodes 13 and 17. A heterodyne oscillator incorporating transistor 20 and a tuned circuit comprising transmission line inductor 21, inductance shunt 33, and varactor diode 22 oscillates at a frequency displaced from the received UHF signal by 45 MHz. The heterodyning oscillator signal and the received UHF signal are combined by mixer diode 23 which is mutually coupled to the double-tuned interstage filter and the heterodyne oscillator. Mixer diode 23 produces an intermediate frequency signal containing the video and audio components of the received UHF television signal. The intermediate frequency signal is passed through a filter network 25 which filters out any high frequency components attributable to the received UHF signal and the heterodyne oscillator signal. The intermediate frequency signal is then applied to terminal 26, which is connected to capacitor 34, through switching diode 28 for coupling to the IF stages of the television receiver. The frequency of oscillation of the heterodyne oscillator is also controlled by the tuning voltage at terminal 9 which is impressed on varactor diode 22 through resistor 27 and RF choke 29. Thus, it can be seen that all of the tuned circuits of the UHF varactor tuner are controlled by the tuning voltage.

As well known in the art, in order to achieve optimum performance of the UHF tuner, all tuned circuits must be matched. That is, for a given variation in the tuning voltage, the resonant frequencies of the tuned circuits should all change by an equal amount. Unfortunately, nonuniform varactor diodes and critical UHF tuner assembly tolerances require additional inductor trimming and capacitor trimming devices in order to match the tuned circuits.

Trimming of the tuned circuits is provided by trimming capacitors 8, 14 and 16 placed in parallel with varactor diodes 7, 13 and 17 respectively. In addition, transmission line inductors 5, 12, 15 and 21 are trimmed by inductance shunts 30, 31, 32 and 33 respectively. While each of the tuned circuits shown incorporate trimming devices, obviously one stage need not have trimming devices and tracking may be achieved by matching the other stages to it. Once the trimming devices are properly adjusted, all of the tuned circuits of the UHF tuner represented in FIG. 1 will properly track together.

Figures 2, 3, 4:
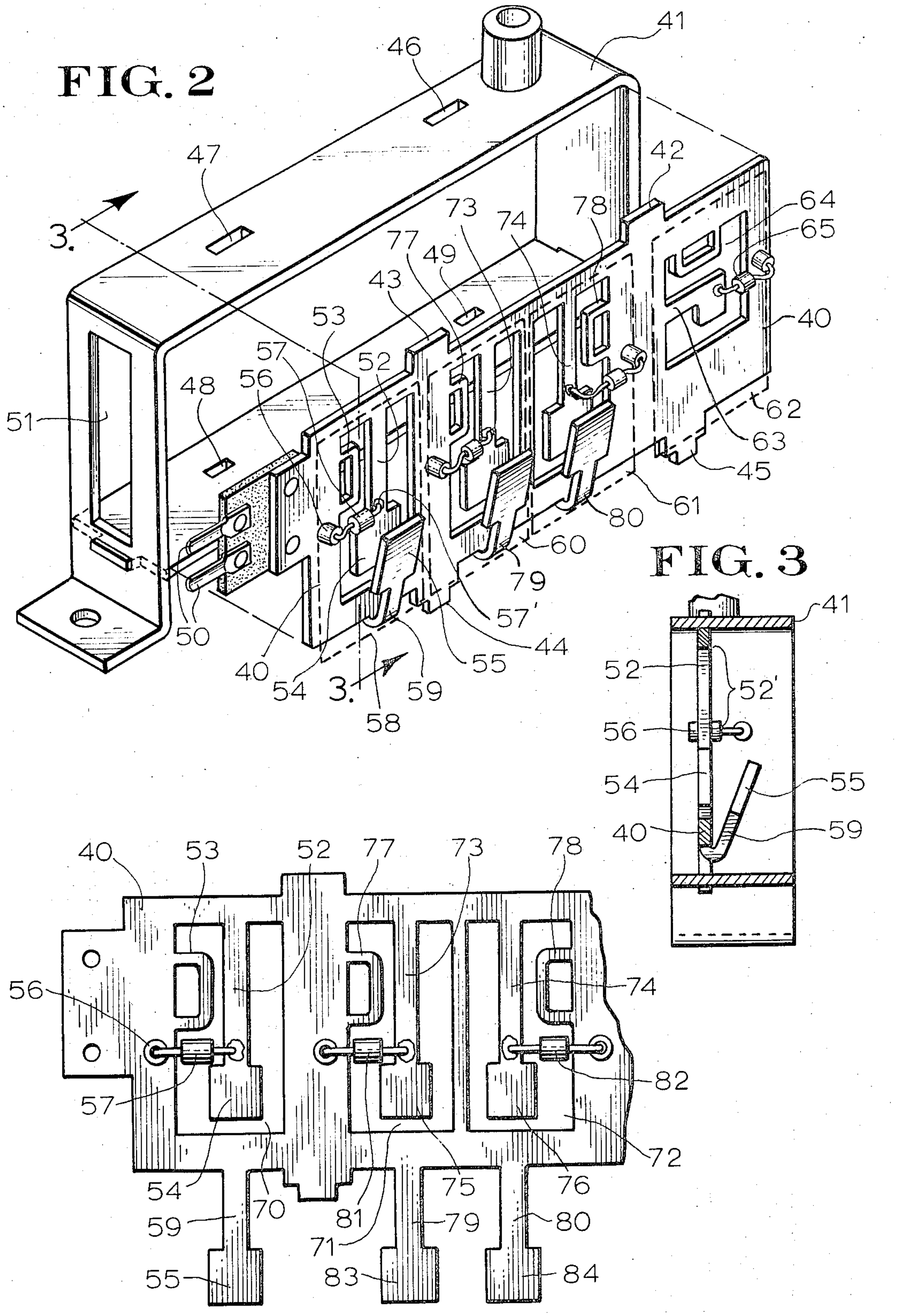
FIG. 2 is an exploded perspective view of a UHF varactor tuner chassis embodying the present invention and its relative relation to an enclosure in which the chassis is to be mounted.
FIG. 3 is a cross sectional view taken along lines 3—3 of FIG. 2.
FIG. 4 is a surface top view to an enlarged scale of a portion of the chassis of FIG. 1.

FIG. 2 shows a tuner chassis embodying the present invention. The chassis is a substantially planar sheet of metal of unitary construction and provides inductance and capacitance trimming to achieve tracking of all tuned circuits of the UHF tuner. Most of the discrete components of the tuner are not shown for purposes of clarity.

Tuner chassis 40 may be mounted in tuner housing 41 and indexed into place by indexing tabs 42, 43, 44 and 45 being received into indexing slots 46, 47, 48 and 49 respectively. Secured to chassis 40 are antenna terminals 50 for connecting the UHF tuner to an appropriate antenna. Terminals 50 through a slot 51 when the chassis is secured within the housing 41. Tuner chassis 40 provides all of the trimming components necessary for matching the tuned circuits of the tuner. One such tuned circuit to be trimmed, tuned circuit 58, comprises transmission line inductor 52, inductance shunt 53, capacitor plate 54, and capacitor plate 55. This tuned circuit corresponds to the tuned circuit comprising transmission line inductor 5, trimming capacitor 8, and inductance trim band 30 of FIG. 1. To complete the tuned circuit a varactor diode 57 is connected between terminal hole 57' and feedthrough capacitor 56. Transmission line inductor 52 is dimensioned such that at the UHF frequencies it represents an appropriate inductance. Inductance shunt 53, which is an extension of the chassis or preferably in the form of a generally U-shaped band as shown, is in close proximity to transmission line inductor 52 and, by bending inductance shunt 53 either direction perpendicular to the plane of chassis 40, the distance between it and transmission line inductor 52 may be varied. This allows for trimming of transmission line inductor 52. Transmission line inductor 52 terminates in a capacitor plate 54. Capacitor plate 54 is aligned such that capacitor plate 55 at the end of tab 59 will be in close proximity to plate 54 when tab 59 is bent over as shown. The distance between plates 54 and 55 can be varied by bending tab 59 to achieve capacitance trimming of varactor diode 57, which is in parallel with the trimming capacitor and the capacitance of feedthrough capacitor 56. This basic chassis construction is repeated for tuned circuits 60 and 61 and is similar to the construction of tuned circuit 62. Tuned circuits 60 and 61 comprise the double-tuned interstage filter previously described in relation to FIG. 1. The width of the chassis separating the two tuned circuits is relatively narrow to assure efficient mutual coupling between the two tuned circuits. Tuned circuit 62, the heterodyne oscillator tuned circuit, only comprises transmission line inductor 63, inductance shunt 64, and varactor diode 65. It does not incorporate a trimming capacitor because the trimming devices of the other tuned circuits match those circuits to the tuned circuit of the heterodyne oscillator. If desired, shunt 64 could be omitted also. As previously mentioned, one tuned circuit need not incorporate trimming devices. For this embodiment the tuned circuit of the heterodyne oscillator was selected not to be trimmed, but it could of course have been any of the other tuned circuits designed to have the highest stray capacitance.

The relative positioning of capacitor plates 54 and 55 may be clearly seen in FIG. 3. Chassis 40 is shown mounted in tuner housing 41. The effective length of transmission line inductor 52 is represented by portion 52'. As previously explained, transmission line inductor 52 is proportioned so that at UHF frequencies, it appears as an inductance. Tab 59 as shown is bent over such that the plates 54 and 55 are in close proximity to each other, creating a trimming capacitance which may be varied by bending tab 59 in different amounts.

FIG. 4 is a surface view of a portion of chassis 40 and further illustrates the relative placement of the different trimming components. For the tuned circuits there represented, the chassis defines openings 70, 71 and 72 in the metal sheet with transmission line inductors 52, 73 and 74 respectively extending therein and terminating in capacitor plates 54, 75 and 76 respectively. The inductance shunts 53, 77 and 78, which provide inductance trimming, extend into the openings in close proximity to the transmission line inductors 52, 73 and 74, respectively. Tabs 59, 79 and 80 respectively are aligned with capacitor plates 54, 75 and 76 respectively in such a way that when bent over, capacitor plates 55, 83 and 84 will be in close proximity with plates 54, 75 and 76 respectively. The trimming capacitors thus formed are in parallel with varactors 57, 81 and 82 respectively.

The present invention makes it possible to construct a UHF tuner which minimizes the number of individual component parts for providing inductance and capacitance trimming of the tuned circuits. The chassis is of unitary construction and may be produced by stamping or other well known manufacturing technique. Individual component parts for trimming of the tuned circuits are not needed and, of course, need not be separately mounted to the chassis which eliminates a number of manufacturing operations. In addition, since the trimming components and the transmission line inductors are not disposed on the chassis perpendicular to the plane of the chassis, there is minimum interference with the wiring of the other tuner components, and the chassis surface between the tuned circuits provides effective shielding therebetween.

While a particular embodiment of the invention has been shown and described, it will be obvious to those skilled in the art that changes and modifications may be made without departing from the invention in its broader aspects and therefore, the aim in the appended claims is to cover all such changes and modifications as fall within the true spirit and scope of the invention.

We claim:

1. A UHF tuner of the type for receiving television signals within the 470 to 890 $MH_z$ frequency range and for converting said signals to intermediate frequency signals having video and audio components, and having a metal chassis and a plurality of tuned circuits tuned by capacitance and inductance wherein the improvement comprises:

at least one of said tuned circuits comprising a transmission line inductor, a trimming capacitor, and an inductance shunt, each formed from said chassis to thereby minimize the individual component parts for providing said inductance, capacitance, and effective trimming therefor.

2. A UHF tuner in accordance with claim 1 where said chassis has a substantially planar surface and where said transmission line inductor, said trimming capacitor, and said inductance shunt lie substantially within said plane.

3. A UHF tuner in accordance with claim 1 where said transmission line inductor terminates in a first capacitor plate and where a second capacitor plate integral with said chassis overlies said first capacitor plate to constitute said trimming capacitor.

4. A UHF tuner in accordance with claim 3 where said second capacitor plate is a termination of a tab extension of said chassis.

5. A UHF tuner in accordance with claim 1 where said inductance shunt is an extension of said chassis in close proximity to said transmission line inductor.

6. A UHF tuner in accordance with claim 5 where said extension is a generally U-shaped band of said chassis.

7. A UHF tuner in accordance with claim 1 where each said tuned circuit additionally comprises a varactor diode.

* * * * *